United States Patent [19]

Rypkema

[11] Patent Number: 4,464,635
[45] Date of Patent: Aug. 7, 1984

[54] NON-REACTIVE LIMITER

[75] Inventor: Jouke N. Rypkema, Lombard, Ill.

[73] Assignee: Zenith Electronics Corporation, Glenview, Ill.

[21] Appl. No.: 442,543

[22] Filed: Nov. 18, 1982

[51] Int. Cl.³ .............................................. H03G 3/30
[52] U.S. Cl. .................................... 330/284; 330/136; 307/551
[58] Field of Search ............... 330/136, 145, 254, 283, 330/284; 455/249; 307/264, 551, 561, 565; 329/132, 134

[56] References Cited

U.S. PATENT DOCUMENTS

| | | | |
|---|---|---|---|
| 3,497,721 | 2/1970 | Dexter | 307/565 |
| 3,829,606 | 8/1974 | Kawamata et al. | 178/5.8 R |
| 3,927,381 | 12/1975 | Sato et al. | 330/284 X |
| 4,232,278 | 11/1980 | Gawronski et al. | 333/13 |
| 4,256,975 | 3/1981 | Fukushima et al. | 307/543 |
| 4,275,362 | 6/1981 | Harford | 330/283 |
| 4,344,047 | 8/1982 | Dixon, Jr. | 333/17 L |
| 4,349,842 | 9/1982 | Apeldoorn et al. | 358/197 |

OTHER PUBLICATIONS

Microwave J "100 kw Solid State Coaxial Limiter for L-Band", vol. 25, No. 1, 1/82, pp. 93-94, 96-97.
IEEE MTT S Int. Symp. Dig., "100 kw Solid-State Coax. Limiter for L-Band", 1981 L.A., CA, 6/15-19, 1981, IEEE, pp. 249-251.
J. Inst. Electron Telecom. Eng., "Design & Obs. Char. of X-Band Pin Diode Limiters", vol. 21, No. 7, 7/75, pp. 378-382.
Eur. Microwave Conf., "Pin Diode Limiter Dynamics", 1973 Proc., Brussels U., Belgium, 9/4-7, 1973, vol. 1, Pap. A.9.5.
Solid State Electron, "Computer Study of Power-Limiter Diode Behavior", vol. 17, No. 9, Sep. 1974, pp. 951-961.

Primary Examiner—James B. Mullins
Assistant Examiner—Steven J. Mottola

[57] ABSTRACT

A non-reactive limiter for limiting the amplitude of a carrier signal amplitude modulated by a modulating signal comprises a voltage divider including a fixed resistance and a variable resistance, the latter preferably comprising a PIN diode. The amplitude modulated carrier signal is applied across the voltage divider while a current is established through the PIN diode in response to the modulating signal for linearly varying its resistance in inverse relation to the instantaneous level of the amplitude modulated carrier signal so as to develop an amplitude limited carrier signal across the PIN diode.

6 Claims, 1 Drawing Figure

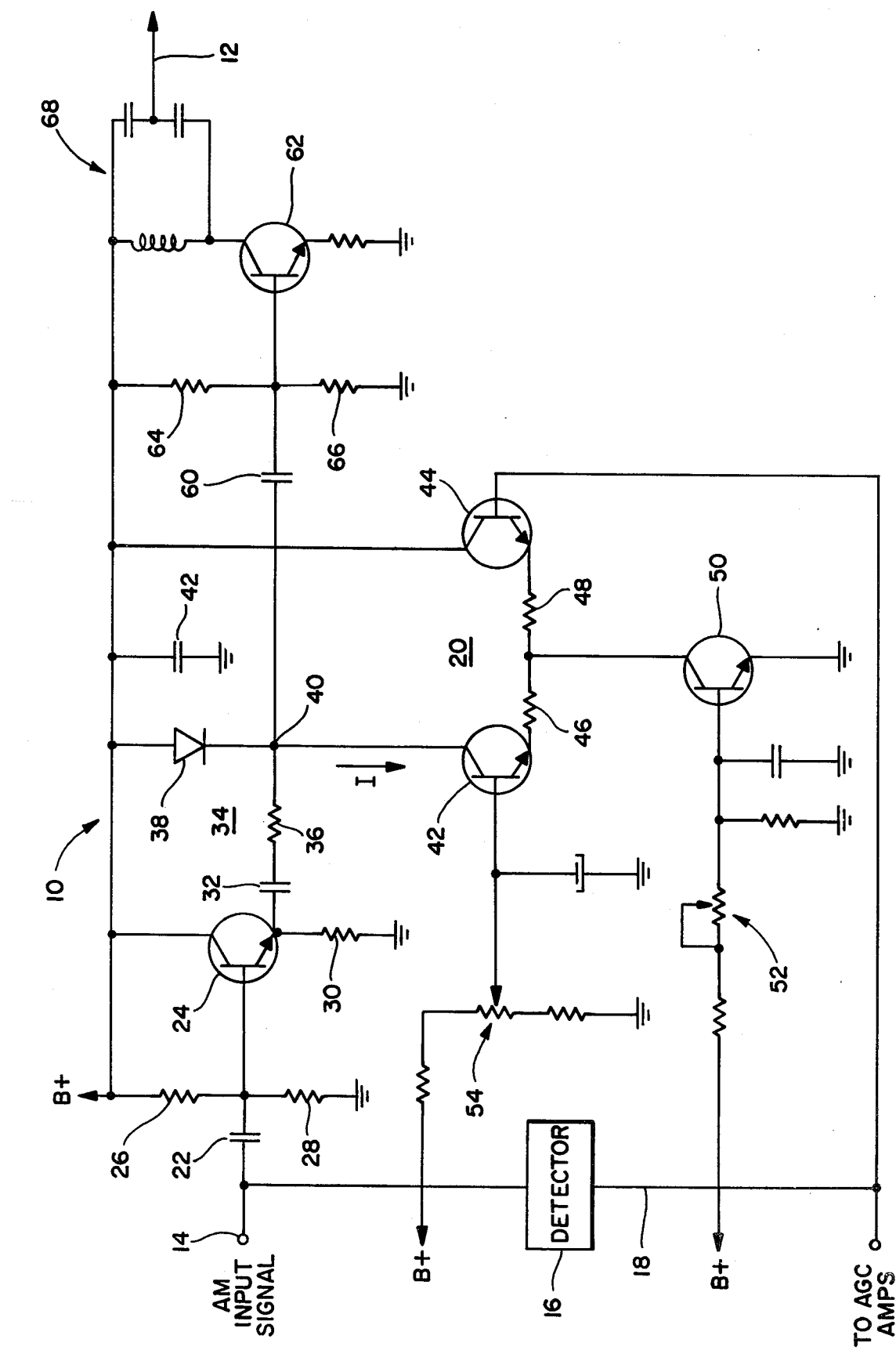

NON-REACTIVE LIMITER

BACKGROUND OF THE INVENTION

The present invention relates generally to limiter circuits used to limit the amplitude of an amplitude modulated carrier signal and is particularly directed to limiter circuits using non-reactive components.

Limiter circuits are commonly used for amplitude limiting an amplitude modulated carrier signal prior to applying the signal to a variety of networks such as phase lock loops and carrier exaltation circuits. Conventional limiters characteristically exhibit a variety of reactive effects such as internal parasitic reactive effects brought about largely by the variable capacity of integrated circuit components as a function of input current, and voltage level and frequency. Additional reactive effects result from externally connected capacitors and inductors which form resonant circuits having Q's that vary with input signal level and the frequency response of which may be unsymmetrical in relation to the applied carrier. These reactive effects contribute to impart angle modulation to the limited signal, the amount of angle modulation introduced generally being a function of the instantaneous level of the applied amplitude modulated carrier. Such angle modulation can seriously degrade circuit performance especially in the case where the limiter supplies a network whose output is processed with another carrier having angle modulation information components.

For example, as disclosed in co-pending application Ser. No. 378,569 filed May 17, 1982, in television receivers using intercarrier sound detection techniques, a phase lock loop or carrier exaltation circuit may be used to generate a substantially unmodulated carrier signal having a frequency equal to the video intermediate frequency of 45.75 MHz. The unmodulated 45.75 MHz carrier may be mixed with the frequency modulated 41.25 MHz intermediate frequency audio signal to produce a 4.5 MHz intercarrier signal which is then subsequently demodulated by an FM demodulator for reproduction by a suitable speaker system. In this application, any angle modulation imparted to the 45.75 MHz video carrier generated by the phase lock loop, such as by the limiter used in association therewith, will be transferred to the intercarrier sound signal by the mixer. Upon detection and reproduction of the intercarrier signal, the imparted angle modulation components may be manifested by an audible buzz in the reproduced audio signal. Audible buzz generated in this manner is especially objectionable in high fidelity television audio transmissions such as those using stereophonic techniques.

It is therefore a basic object of the present invention to provide an improved circuit for limiting the amplitude of an amplitude modulated signal.

It is a more specific object of the invention to provide a circuit for limiting the amplitude of an amplitude modulated signal without introducing angle modulation in the limited signal.

It is yet a further object of the invention to provide a limiter circuit using no reactive components for limiting the amplitude of an amplitude modulated signal without introducing angle modulation in the limited signal.

BRIEF DESCRIPTION OF THE DRAWINGS

The invention, together with its objects and the advantages thereof, may best be understood by reference to the following description taken in conjunction with the accompanying drawing in which the sole FIGURE schematically illustrates a presently preferred embodiment of the invention.

DESCRIPTION OF THE PREFERRED EMBODIMENT

Referring to the drawings, the sole FIGURE schematically illustrates a presently preferred embodiment of a non-reactive limiter 10 according to the present invention. The limiter 10 is adapted for developing an amplitude limited signal having substantially no angle modulation at an output 12 in response to an amplitude modulated carrier signal supplied to an input terminal 14. The input amplitude modulated signal may, by way of the previously referred to example, comprise a band-limited television intermediate frequency video carrier at 45.75 MHz amplitude modulated by a composite baseband video signal. In this application, the amplitude limited signal developed at output 12 of the limiter 10 may be applied to a phase lock loop or to a carrier exaltation circuit whose output, in turn, may be mixed with an intermediate frequency sound signal (41.25 MHz) to produce a 4.5 MHz intercarrier sound signal. In either case, improved circuit performance is achieved by the fact that the amplitude limited signal is characterized by substantially no angle modulation.

Returning to the FIGURE, the amplitude modulated signal is coupled from input terminal 14 to a detector 16 which recovers the modulating signal or envelope on a conductor 18. As will be explained in further detail hereinafter, the modulating signal on conductor 18 is applied as a control input to a differentially connected current steering network 20. In addition, the detected modulating signal on conductor 18 may be used to form an AGC signal for application to the RF and IF amplifiers of the receiver (not shown) to maintain a constant level video signal at input terminal 14.

The input amplitude modulated signal is also applied through a coupling capacitor 22 to the base of a buffer transistor 24. Base bias for the transistor 24 is supplied by a voltage divider comprising resistors 26 and 28 connected in series between a source of positive bias potential B+ and ground potential. The collector of transistor 24 is also coupled to positive bias potential B+ while the transistor's emitter is coupled for applying the input amplitude modulated signal through a resistor 30 and a coupling capacitor 32 across a resistive voltage divider 34. Voltage divider 34 comprises a fixed resistor 36 and a variable resistance 38 which, in a preferred embodiment of the invention comprises a PIN diode. The cathode of PIN diode 38 and the fixed resistor 36 are connected at a common node 40 and the anode of the diode is connected to positive bias potential B+ and also to an RF by-pass capacitor 42.

It is known that PIN diodes exhibit a substantially linear resistance versus current characteristic at frequencies above certain minimum levels. In particular, depending upon the physical make-up of a particular diode, its resistance will vary substantially linearly with the inverse of the diode current for minimum frequencies of about 5 MHz and greater. This feature is used according to the present invention by operating the current steering network 20 for developing an output current I which varies linearly with and in inverse relation to the instantaneous level of the detected modulating signal on conductor 18. The resistance of PIN diode 38 will thereby vary in a substantially linear manner in accordance with the instantaneous level of the input amplitude modulated signal. Since the input amplitude modulated signal is applied across the voltage divider comprising resistor 36 and PIN diode 38, varying the resistance of the PIN diode in the foregoing manner will have the effect of producing a substantially constant or amplitude limited carrier signal at node 40. In other words, due to the action of voltage divider 34, linearly varying the resistance of PIN diode 38 according to the instantaneous level of the input modulating signal will have the effect at node 40 of proportionately attenuating the signal according to its envelope for producing a constant level or amplitude limited carrier signal. Since this controlled attenuation of the input amplitude modulated signal is accomplished entirely by resistive components, no angle modulation will be present in the limited carrier signal at node 40.

It will be appreciated by those skilled in the art that the speed or ability of the PIN diode to follow the applied modulating signal will vary proportionately with the minimum frequency at which the diode assumes a linear resistance versus current characteristic. Therefore, in a given application, the bandwidth of the modulating signal may have to be suitably limited in order to insure that a diode selected for assuming a linear resistance versus current characteristic at a given frequency will also be able to properly follow the applied modulating signal. For example, in the case of television IF frequencies (about 40-45 MHz), it has been found that the modulating signal must be band-limited to about 1 MHz or less to achieve proper operation with most available PIN diodes.

With further reference to the FIGURE, current steering network 20 comprises a pair of differentially connected transistors 42 and 44 whose emitters are coupled together by a pair of resistors 46 and 48. The junction formed between resistors 46 and 48 is connected to the collector of a current source transistor 50 which is suitably biased by a base biasing network 52 from positive supply potential B+. The base of transistor 44 is DC coupled to detector 16 by conductor 18 while the base of transistor 42 is suitably biased by a biasing network 54 from positive supply potential B+. The collector of transistor 42 is connected to node 40 for developing the current I varying the resistance of PIN diode 38 and the collector of transistor 44 is connected to positive supply potential B+.

In operation, assume that the detector 16 is operable for detecting the negative-going envelope of the modulating signal such that the peak levels of the detected signal on conductor 18 are represented by less positive voltages. The maximum instantaneous level of the input amplitude modulated signal, and thereby the maximum peak or minimum positive voltage level of the detected modulating signal on conductor 18, will cause maximum conduction of transistor 42 and minimum conduction of transistor 44. As a result, a maximum current I will be produced in the collector circuit of transistor 42 whereby the resistance exhibited by PIN diode 38 will take on a minimum value. By appropriately selecting the circuit biasing parameters and the resistance of resistor 36 in relation to the resistance characterizing PIN diode 38 in response to the maximum level of current I, the maximum instantaneous level of the input amplitude modulated signal can be limited at node 40 to a desired value. For example, by selecting the value of resistor 36 to have a value of 72 ohms and using a PIN diode having a minimum resistance of 10 ohms at 10 milliamps, the input signal will be attenuated by about 18 dB for achieving a limited carrier signal at node 40.

When the instantaneous level of the input amplitude modulated signal is at a minimum value, the detected modulating signal on conductor 18 will be characterized by a maximum positive voltage level causing minimum conduction of transistor 42 and maximum conduction of transistor 44. Current I will therefore be relatively small and the resistance of PIN diode 38 will exhibit a large value for effecting minimal attenuation of the input signal by voltage divider 34 at node 40. For example, PIN diode 38 may have a resistance of about 700 ohms at 0.1 milliamps such that nearly all of the input signal supplied to voltage divider 34 is developed across the PIN diode.

For instantaneous levels of the input modulating signal between the aforementioned maximum and minimum levels, the detected modulating signal developed on conductor 18 will take on corresponding positive values between its minimum and maximum peak values to linearly vary the conduction of transistors 42 and 44 in opposite senses. Thus, a decreased input signal level will cause a corresponding increase in the positive level of the detected signal thereby causing transistors 44 and 42 to conduct proportionaly more and less heavily respectively. Current I will thereby decrease to linearly increase the resistance of PIN diode 38 so as to reduce the attenuation of the input signal effected at node 40 by the voltage divider 34. On the other hand, a relative increase in the instantaneous level of the input amplitude modulated signal will result in a corresponding decrease in the positive level of the detected signal thereby causing the conduction of transistor 44 to proportionately decrease and the conduction of transistor 42 to proportionately increase. Current I will therefore increase to linearly decrease the resistance of PIN diode 38 so as to increase the attenuation of the input signal effected at node 40 by the voltage divider 34. In summary, amplitude limiting of the input carrier signal is therefore achieved by linearly varying the resistance of PIN diode 38 in inverse relation to the instantaneous level of the input signal so as to effect a purely resistive attenuation thereof at node 40 of voltage divider 34 so as to limit the amplitude of the input signal to a desired level. It will be appreciated that, due to the purely resistive nature of the attenuation provided by voltage divider 34, substantially no angle modulation will be imparted to the amplitude limited signal at node 40.

The amplitude limited signal developed at node 40 is preferably coupled by a capacitor 60 to the base of an output buffer transistor 62. Base bias for the transistor 62 is provided by a voltage divider comprising resistors 64 and 66 connected in series between positive supply potential B+ and ground. The amplitude limited signal is coupled from the collector of transistor 62 through a bandpass filter 68 to output 12.

While a particular embodiment of the invention has been shown and described, it will be obvious to those skilled in the art that changes and modifications may be made without departing from the invention in its broader aspects. For example, it will be appreciated that the illustrated circuit can also operate in response to detection of the positive-going envelope of the input modulated signal by simply reversing the base inputs of transistors 42 and 44. The aim, therefore, in the appended claims is to cover all such changes and modifications as fall within the true spirit and scope of the invention.

I claim:

1. An amplitude limiter for removing the modulation from a carrier signal amplitude modulated by a modulating signal comprising:
   detecting means responsive to the carrier signal for providing a replica of the modulating signal;
   a voltage divider including fixed resistance means and variable resistance means;
   means for applying the amplitude modulated carrier signal across the voltage divider; and
   means responsive to the detected replica of the modulating signal for linearly varying the variable resistance in accordance with the instantaneous amplitude thereof so as to develop a carrier signal across the variable resistance which is substantially free of both amplitude and angle modulation.

2. An amplitude limiter according to claim 1 wherein the variable resistance means comprises a PIN diode having a substantially linear resistance versus current characteristic.

3. An amplitude limiter according to claim 2 wherein the means for varying comprises a current generating network for establishing a current in the PIN diode for linearly varying its resistance in inverse relation to the instantaneous level of the amplitude modulated carrier signal.

4. An amplitude limiter according to claim 3 wherein the current generating network comprises first and second differentially connected transistors having their emitters connected in common to a constant current source, the base and collector of the first transistor be coupled for receiving the detected replica of the modulating signal and a DC supply potential respectively, the base and collector of the second transistor being coupled to a source of bias potential and the PIN diode respectively.

5. An amplitude limiter for removing the modulation from a carrier signal amplitude modulated by a modulating signal comprising:
   detecting means responsive to the carrier signal for providing a replica of the modulating signal;
   a voltage divider including a fixed resistance and a PIN diode having a substantially linear resistance versus current characteristic above a given frequency;
   means for applying the amplitude modulated carrier signal across the voltage divider; and
   current generating means responsive to the detected replica of the modulating signal for establishing a current in the PIN diode for linearly varying its resistance in inverse relation to the instantaneous level of the modulating signal so as to develop a carrier signal across the PIN diode which is substantially free of both amplitude and angle modulation.

6. An amplitude limiter for removing the modulation from a carrier signal amplitude modulated by a modulating signal comprising:
   detecting means responsive to the carrier signal for providing a replica of the modulating signal;
   a voltage divider comprising a series connected fixed resistance and PIN diode having a substantially linear resistance versus current characteristic above a given frequency, the fixed resistance and PIN diode having a common node therebetween;
   means for applying the amplitude modulated carrier signal across the voltage divider; and
   current generating means responsive to the detected replica of the modulating signal for establishing a current in the PIN diode for linearly varying its resistance in inverse relation to the instantaneous level of the modulating signal so as to develop a carrier signal at the common node which is substantially free of both amplitude and angle modulation.

* * * * *